United States Patent
Voloshin et al.

(10) Patent No.: US 8,036,331 B2
(45) Date of Patent: Oct. 11, 2011

(54) OFFSET FREQUENCY ESTIMATION METHOD AND APPARATUS

(75) Inventors: Dmitry Voloshin, Yongin-si (KR); Il-Yong Jong, Yongin-si (KR)

(73) Assignee: Samsung Electronics Co., Ltd., Suwon-Si, Gyeonngi-Do (KR)

(*) Notice: Subject to any disclaimer, the term of this patent is extended or adjusted under 35 U.S.C. 154(b) by 1210 days.

(21) Appl. No.: 11/736,686

(22) Filed: Apr. 18, 2007

(65) Prior Publication Data

US 2007/0248198 A1   Oct. 25, 2007

(30) Foreign Application Priority Data

Apr. 21, 2006   (KR) .................. 10-2006-0036320

(51) Int. Cl.
*H04L 7/00* (2006.01)
(52) U.S. Cl. ............................................. 375/356
(58) Field of Classification Search .............. 375/354, 375/356, 316, 324, 326
See application file for complete search history.

(56) References Cited

U.S. PATENT DOCUMENTS 7,352,804 B2 * 4/2008 Yang et al. ................ 375/226

FOREIGN PATENT DOCUMENTS

| EP | 1235401 | | 8/2002 |
| GB | 2394131 A | * | 4/2004 |
| JP | 2002-271430 | | 9/2002 |
| KR | 1020050030807 | | 3/2005 |
| KR | 1020050067326 | | 7/2005 |
| WO | WO 2006027604 A1 | * | 3/2006 |

OTHER PUBLICATIONS

Office Action dated Aug. 20, 2010 in corresponding German Patent Appln. No. 10 2007 018 807.6-35.

* cited by examiner

*Primary Examiner* — Dac Ha
*Assistant Examiner* — Vineeta Panwalkar
(74) *Attorney, Agent, or Firm* — F. Chau & Associates, LLC

(57) ABSTRACT

An offset frequency estimation method includes receiving an input signal comprised of complex samples, detecting phases of the complex samples, estimating a temporary offset frequency and an initial phase from the detected phases of the complex samples using a linear regression analysis method, and estimating a final offset frequency by skipping error samples detected using the temporary offset frequency and the initial phase.

25 Claims, 9 Drawing Sheets

OFFSET FREQUENCY ESTIMATION METHOD AND APPARATUS

CROSS-REFERENCE TO RELATED PATENT APPLICATION

This application claims the benefit of Korean Patent Application No. 10-2006-0036320, filed on Apr. 21, 2006 the disclosure of which is herein incorporated by reference in its entirety.

BACKGROUND OF THE INVENTION

1. Technical Field

The present disclosure relates to an offset frequency estimation method and apparatus, and more particularly, to an offset frequency estimation method and apparatus for preventing incorrect offset frequency estimation by using adaptive skipping of error samples.

2. Discussion of Related Art

In general, in systems using a modulation method, such as phase shift keying (PSK) or minimum shift keying (MSK), correct estimation of a carrier frequency offset is important.

A conventional offset frequency estimation apparatus receives an input signal comprised of complex samples. The received samples may contain noise generated in a transmission/reception process.

A reference sample is a signal that does not contain a noise component and can be obtained by equalizing and filtering the received samples. The reference sample or the received samples can be conjugated. A signal pre-set in transmission and reception systems can also be used as the reference sample.

For the convenience of description, it is assumed that the reference sample is conjugated. Conventionally, the offset frequency estimation apparatus multiplies the received samples by a conjugate value of the reference sample. However, when the received samples are conjugated, the offset frequency estimation apparatus multiplies the reference sample by a conjugate value of the received samples.

Phases of the received samples varying with time are detected from the result obtained by multiplying the received samples by the conjugate value of the reference sample. The detected phases of the received samples can be converted to an offset frequency using a least squares method.

Equations 1 through 4 show a conventional offset frequency estimation process.

$$R = S * e^{j\omega t} \quad (1)$$

Here, R denotes a received sample $e^{j\omega t}$ denotes a noise component generated in a signal transmission/reception process, and S denotes the reference sample, which does not contain the noise component.

$$X = R * S^* \quad (2)$$

$$= S * e^{j\omega t} * S^*$$

$$= A * e^{j\omega t}$$

$$= A * (\cos\omega t + j\sin\omega t)$$

Equation 2 shows the case where the reference sample is conjugated.

$$\omega t + \phi + \epsilon = \arctan(\sin \omega t / \cos \omega t) \quad (3)$$

$$(\omega t + \varphi + \varepsilon) \overset{LS}{\rightarrow} (\hat{\omega}) \quad (4)$$

In the conventional offset frequency estimation process described above, an error may be generated due to error samples in the offset frequency estimation process. Incorrect offset frequency estimation can result in incorrect detection of a reception frequency.

SUMMARY OF THE INVENTION

Exemplary embodiments of the present invention generally provide offset frequency estimation methods and apparatus for preventing incorrect offset frequency estimation due to error samples.

According to an exemplary embodiment of the present invention, there is provided an offset frequency estimation method comprising receiving an input signal comprised of complex samples; detecting phases of the complex samples, estimating a temporary offset frequency and an initial phase from the detected phases of the complex samples using a linear regression analysis method; and estimating a final offset frequency by skipping error samples detected using the temporary offset frequency and the initial phase.

The error samples may be complex samples of which a difference between the detected phase and an estimated phase of the complex samples is greater than a predetermined value. The estimated phase may be obtained using the linear regression analysis method wherein the temporary offset frequency and the initial phase are used as parameters. The initial phase may be a phase difference between transmission and reception systems of the complex samples, which is generated as a result of synchronization mismatching between the transmission and reception systems.

The final offset frequency may be estimated from detected phases of complex samples excluding the error samples among the complex samples. In the estimating of the final offset frequency, the number of error samples to be skipped may be set based on an order of magnitude of the error values.

The estimating of the final offset frequency may comprise: calculating error values indicating differences between the detected phases and estimated phases, setting complex samples having more than a predetermined error value among the complex samples as the error samples; and estimating the final offset frequency using detected phases of complex samples excluding the error samples.

The estimating of the final offset frequency may further comprise arranging the complex samples by an order of magnitude of the error values. The error values may be absolute values of the differences between the detected phases and the estimated phases. The estimated phases may be obtained using the linear regression analysis method wherein the temporary offset frequency and the initial phase are used as parameters.

The detecting of the phases of the complex samples may comprise, generating a first value by conjugating a reference sample; generating second values by multiplying the first value by each of the complex samples; and obtaining each phase of the complex samples using the second values.

The reference sample may be a signal without a noise component generated in a transmitting/receiving process of the complex samples. In the obtaining of each phase of the complex samples from the second value, when the second value is an (A+jB) type complex number, the detected phase of the complex samples is an arctan(B/A).

The detecting of the phases of the complex samples may comprise: generating third values by conjugating each of the complex samples; generating fourth values by multiplying the third values by a reference sample; and obtaining each phase of the complex samples using the fourth values.

The linear regression analysis method may be a least squares method.

According to an exemplary embodiment of the present invention, there is provided an offset frequency estimation apparatus comprising: a receiver receiving an input signal comprised of complex samples; a phase detector detecting phases of the complex samples; a first estimator estimating a temporary offset frequency and an initial phase from the detected phases of the complex samples using a linear regression analysis method; and a second estimator estimating a final offset frequency by skipping error samples detected by the temporary offset frequency and the initial phase.

The second estimator may comprise, an error value calculator calculating error values indicating differences between the detected phases and estimated phases; a setting unit setting complex samples having more than a predetermined error value among the complex samples as the error samples; and an estimator estimating the final offset frequency using detected phases of complex samples excluding the error samples.

The second estimator may further comprise a reordering unit arranging the complex samples by the order of magnitude of the error values.

The phase detector may comprise: a conjugate unit generating a first value by conjugating a reference sample; a multiplier generating second values by multiplying the first value by each of the complex samples, and a detector obtaining a phase of each of the complex samples using the second values.

The conjugate unit may generate third values by conjugating each of the complex samples. The multiplier may generate fourth values by multiplying the third value by a reference sample, and the detector may obtain a phase of each of the samples using the fourth values.

The linear regression analysis method may be a least squares method.

BRIEF DESCRIPTION OF THE DRAWINGS

The present invention will become readily apparent to those of ordinary skill in the art when descriptions of exemplary embodiments thereof are read with reference to the accompanying drawings.

DESCRIPTION OF EXEMPLARY EMBODIMENTS

Figure 1:
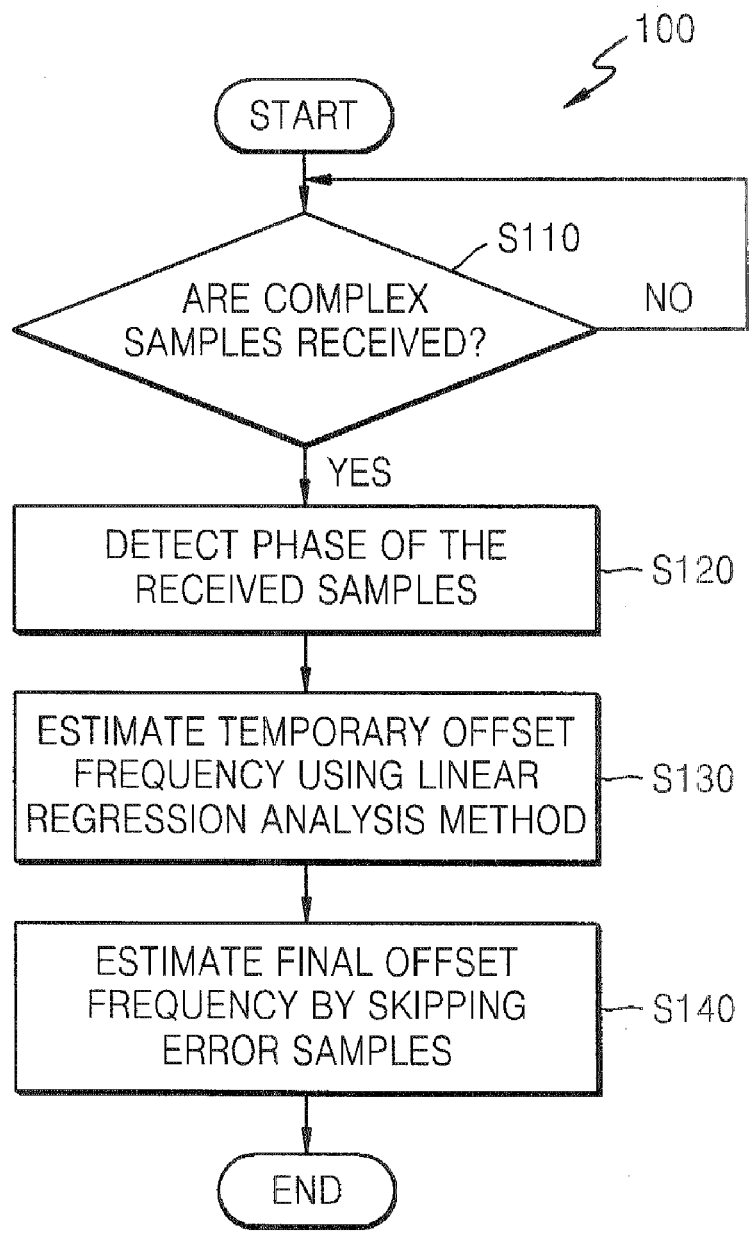
FIG. 1 is a flowchart illustrating an offset frequency estimation method according to an exemplary embodiment of the present invention.

Hereinafter, exemplary embodiments of the present invention will be described in detail with reference to the accompanying drawings. Like reference numerals refer to similar or identical elements throughout the description of the figures.

FIG. 1 is a flowchart illustrating an offset frequency estimation method 100 according to an exemplary embodiment of the present invention.

Referring to FIG. 1, the offset frequency estimation method 100 includes receiving complex samples in step S110, detecting phases of the received samples in step S120, estimating a temporary offset frequency and an initial phase from the detected phases of the received samples using a linear regression analysis method in step S130, and estimating a final offset frequency by skipping error samples detected by the temporary offset frequency and the initial phase in step S140.

The linear regression analysis method may be, for example, a least squares method.

Figure 2:
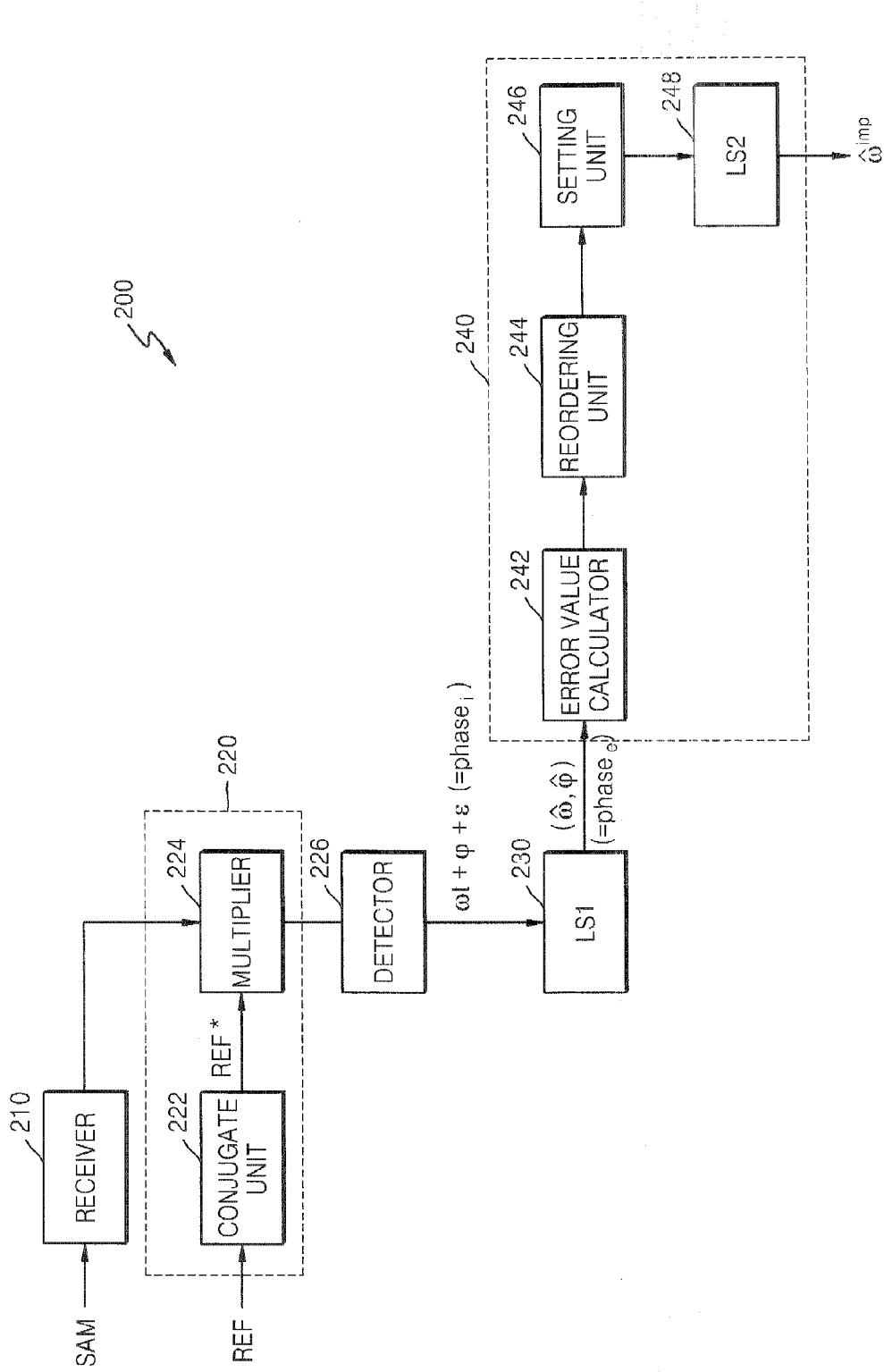
FIG. 2 is a block diagram of an offset frequency estimation apparatus according to an exemplary embodiment of the present invention.

FIG. 2 is a block diagram of an offset frequency estimation apparatus 200 according to an exemplary embodiment of the present invention.

Referring to FIG. 2, the offset frequency estimation apparatus 200 includes a receiver 210, a phase detector 220, a first estimator 230, and a second estimator 240.

Hereinafter, offset frequency estimation operations will be described in detail with reference to FIGS. 1 and 2. Referring to FIGS. 1 and 2, in step S110, the receiver 210 receives complex samples SAM. The received samples SAM are given by Equation 1.

In step S120, the phase detector 220 detects the phases $phase_i$ of the received samples SAM, where $phase_i$ denotes a detected phase of a received sample i. To detect the phases $phase_i$ of the received samples SAM, the phase detector 220 includes a conjugate unit 222, a multiplier 224, and a detector 226.

Figure 3A:
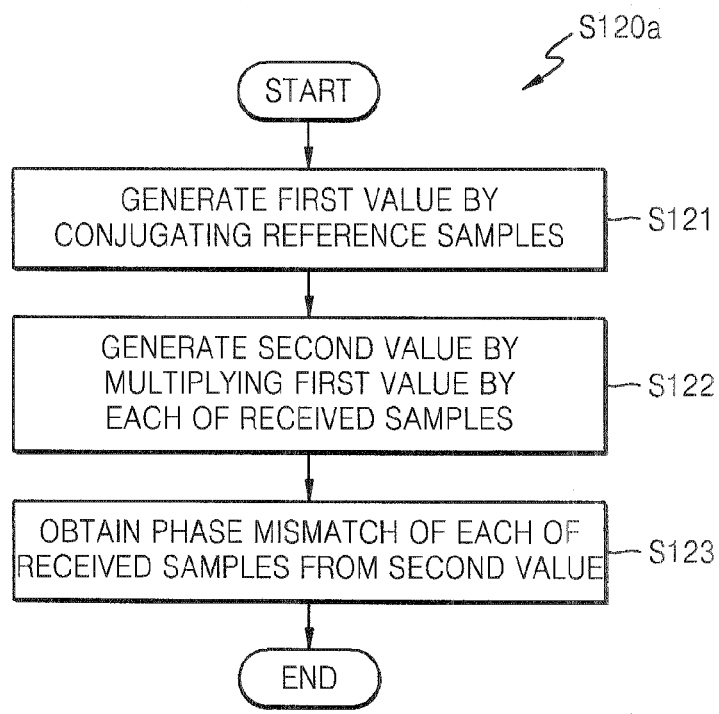
FIGS. 3A and 3B are flowcharts illustrating detection of received samples performed in the method of FIG. 1.
Figure 3B:
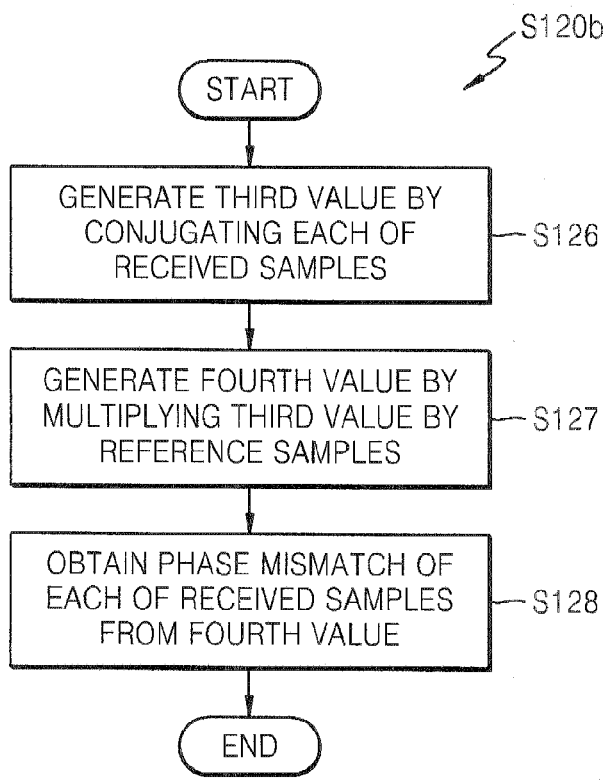

FIGS. 3A and 3B are flowcharts illustrating step S120 of FIG. 1.

Referring to FIGS. 2 and 3A, in step S121, the conjugate unit 222 generates a first value by conjugating a reference sample REF. In step S122, the multiplier 224 generates a second value by multiplying the first value by the received samples SAM. In step S123, the detector 226 obtains the phase $phase_i$ of the received samples SAM using the second value.

A method of detecting the phase $phase_i$ of the received samples SAM is given by Equations 2 and 3. The phase $phase_i$ of the received samples SAM may have the value $\omega t + \phi + \epsilon$ according to Equation 3. The phase $phase_i$ of the received samples SAM is called a detected phase $phase_i$.

The reference sample REF is a signal that does not contain a noise component generated in a transmission/reception process of the received samples SAM. The reference sample REF can be obtained by equalizing and filtering the received sample SAM. A signal pre-set in transmission and reception systems can also be used as the reference sample REF.

Referring to FIGS. 2 and 3B, in step S126, the conjugate unit 222 generates a third value by conjugating the received samples SAM. In step S127, the multiplier 224 generates a fourth value by multiplying the first value by the reference sample REF. In step S128, the detector 226 obtains the phase phase$_i$ of the received samples SAM using the fourth value.

The phase phase$_i$ of the received samples SAM is obtained by Equation 3 even if the reference sample REF or the received samples SAM are conjugated. However, for the convenience of description, FIG. 2 illustrates that the reference sample REF is conjugated.

Figure 4:
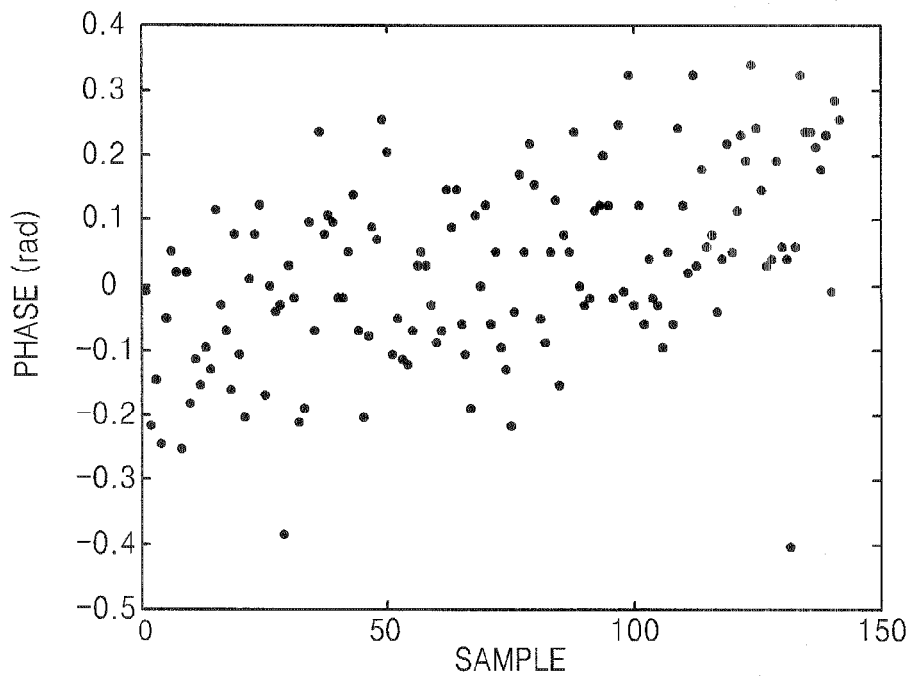
FIG. 4 is a diagram showing a result obtained by detecting phases of received samples as illustrated in FIGS. 1 and 2.

FIG. 4 is a diagram showing a result obtained by detecting the phases phase$_i$ of the received samples SAM using the method or apparatus described in connection with FIG. 1 or FIG. 2, respectively. Referring to FIG. 4, the phases phase$_i$ of the received samples SAM are shown as dots. As shown in FIG. 4, the received samples SAM having the detected phases phase$_i$ are within a predetermined range. In addition, FIG. 4 shows received samples SAM having detected phases that are significantly different from the detected phases phase$_i$ within the predetermined range.

Referring back to FIGS. 1 and 2, in step S130, the first estimator 230 estimates a temporary offset frequency $\hat{\omega}$ and an initial phase $\hat{\phi}$ from the phases phase$_i$ of the received samples SAM using the linear regression analysis method, such as for example, a least squares method. The initial phase $\hat{\phi}$ is a phase difference between transmission and reception systems, which is generated as a result of synchronization mismatching between the transmission and reception of the received samples SAM.

The temporary offset frequency $\hat{\omega}$ and the initial phase $\hat{\phi}$ may be estimated using Equations 5 through 7.

$$\text{phase}_i = \omega \cdot i + \phi \quad (5)$$

Here, $\omega$ and $\phi$ denote an actual offset frequency and an actual initial phase, respectively, existing in the transmission and reception systems, and phase$_i$ denotes a detected phase of a received sample i. Values of the detected phases phase$_i$ are obtained as illustrated in FIG. 4, and thus a process of estimating $\omega$ and $\phi$ is needed.

A process of estimating $\omega$ and $\phi$ using the least squares method will now be described. In particular, 142 received samples SAM are used to describe the estimation of $\omega$ and $\phi$.

$$Y = \begin{bmatrix} \text{phase}_1 \\ \text{phase}_2 \\ \vdots \\ \text{phase}_{142} \end{bmatrix}; X = \begin{bmatrix} 1 & 1 \\ 2 & 1 \\ \vdots & \vdots \\ 142 & 1 \end{bmatrix} \quad (6)$$

The X and Y matrices of Equation 6 are used in the least squares method.

$$\begin{pmatrix} \hat{\omega} \\ \hat{\phi} \end{pmatrix} = (X'X)^{-1} X'Y \quad (7)$$

The temporary offset frequency $\hat{\omega}$ and the initial phase $\hat{\phi}$ of Equation 7 are estimated using the least squares method from the X and Y matrices of Equation 6. Since the least squares method is understood by those of ordinary skill in the art, detailed description of the least squares method is omitted in the interests of simplicity. Unlike conventional offset frequency estimation, the offset frequency estimation method and apparatus according to exemplary embodiments of the present invention can prevent incorrect offset frequency estimation by estimating an offset frequency and an initial phase.

For example, when the received samples SAM illustrated in FIG. 4 are received the temporary offset frequency $\hat{\omega}$ and the initial phase $\hat{\phi}$ are estimated as 0.0017 and −0.0952, respectively, using the least squares method.

Inverting the estimated temporary offset frequency $\hat{\omega}$ and initial phase $\hat{\phi}$, an estimated phase of each received sample SAM can be obtained. The estimated phase of each received sample SAM can be obtained using Equation 8.

$$\text{phase}_i = \hat{\omega} \cdot i + \hat{\phi} \quad (8)$$

Each estimated phase is obtained using the linear regression analysis method in which the temporary offset frequency $\hat{\omega}$ and the initial phase $\hat{\phi}$ are used as parameters. Hereinafter, the estimated phase is denoted as phase$_{est}$ to differentiate it from the detected phase phase$_i$ of the received sample i of Equation 5.

Figure 5:
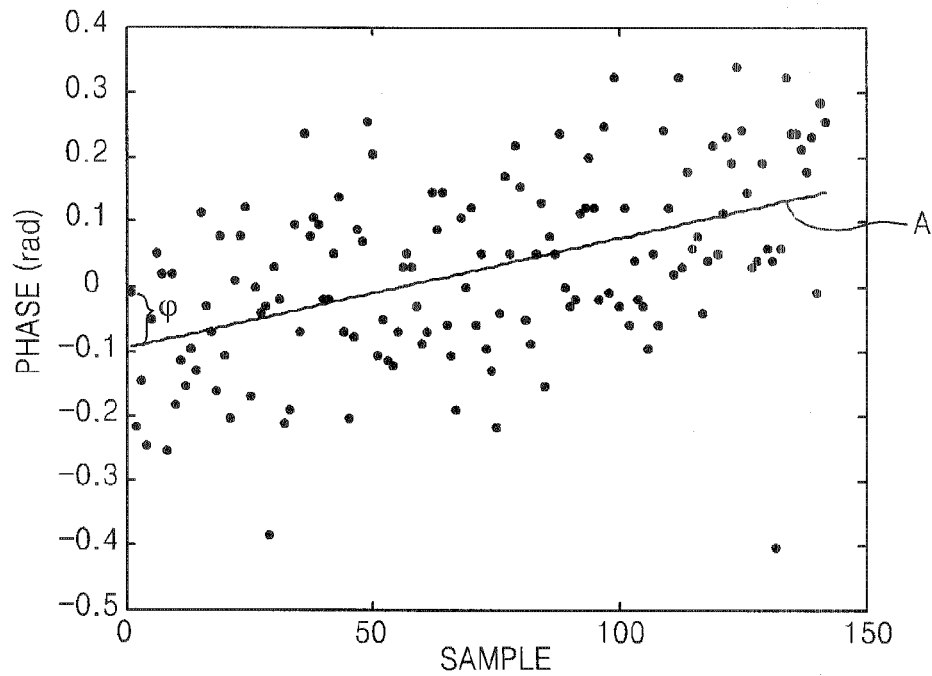
FIG. 5 is a diagram showing a result obtained by estimating a temporary offset frequency and an initial phase as illustrated in FIGS. 1 and 2.

FIG. 5 is a diagram showing a result obtained by estimating the temporary offset frequency $\hat{\omega}$ and the initial phase $\hat{\phi}$ using the method or apparatus described in connection with FIG. 1 or FIG. 2, respectively. Referring to FIG. 5, the estimated phase phase$_{est}$ of each received sample SAM is located on a line A having a slope which is the temporary offset frequency $\hat{\omega}$ and an initial y-axis value of the initial phase $\hat{\phi}$.

Figure 6:
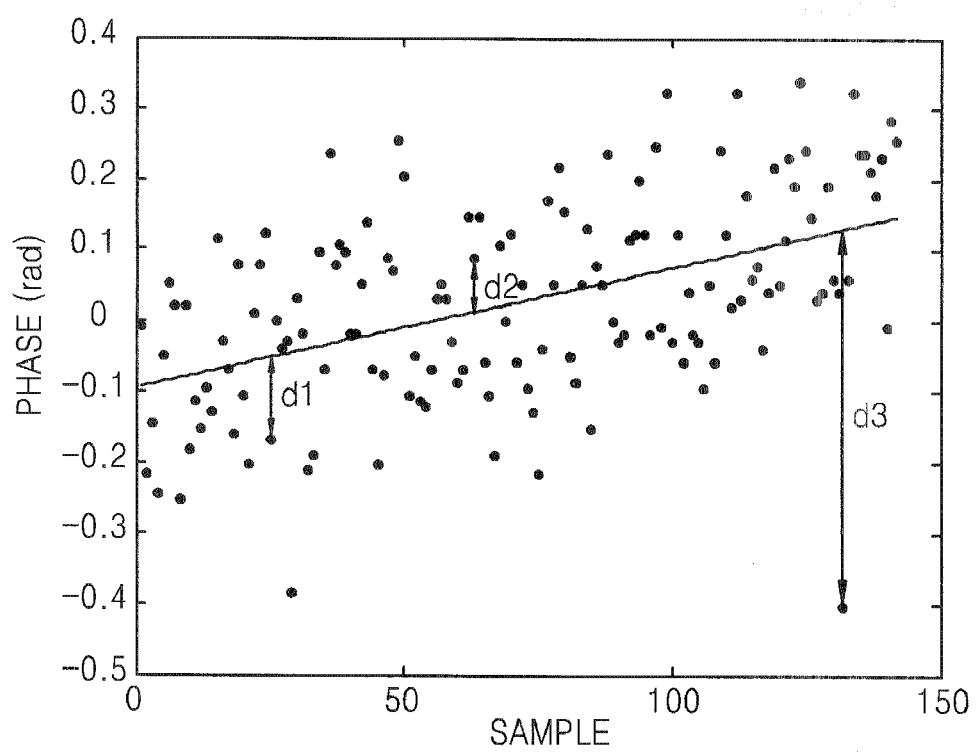
FIG. 6 is a diagram showing differences between estimated phases and detected phases in the method and apparatus illustrated in FIGS. 1 and 2, respectively.

FIG. 6 is a diagram showing differences between estimated phases and detected phases obtained using the method or apparatus described in connection with FIG. 1 or FIG. 2 respectively, FIG. 6 shows differences d1, d2, and d3 between detected phases phase$_i$ and estimated phases phase$_{est}$ located on the line A having a slope which is the temporary offset frequency $\hat{\omega}$ and an initial y-axis value of the initial phase $\hat{\phi}$. A received sample SAM, which has a difference between an estimated phase phase$_{est}$ and a detected phase phase$_i$ greater than a predetermined value, is called an error sample.

Referring to FIGS. 1 and 2, in step S140, the second estimator 240 estimates a final offset frequency $\hat{\omega}^{tmp}$ by skipping error samples detected by the temporary offset frequency $\omega$ and the initial phase $\hat{\phi}$.

That is, according to an exemplary embodiment of the present inventions in step S140, the final offset frequency $\hat{\omega}^{tmp}$ is estimated from detected phases phase$_i$ of received samples SAM excluding error samples among the received samples SAM using the least squares method. The second estimator 240 may include an error value calculator 242, a setting unit 246, and an estimator 248 to estimate the final offset frequency $\hat{\omega}^{tmp}$.

Figure 7:
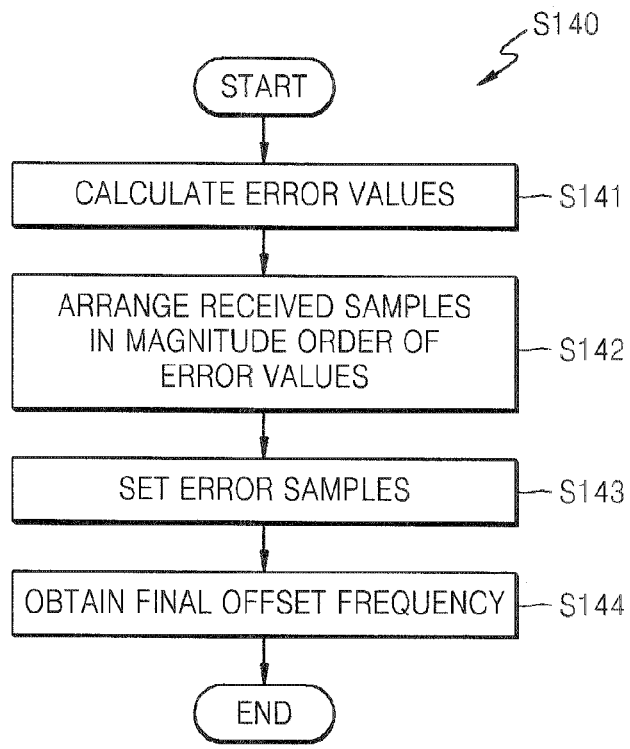
FIG. 7 is a detailed flowchart illustrating an estimation of a final offset frequency as performed in the method of FIG. 1.

FIG. 7 is a flowchart illustrating the step S140 of FIG. 1.

Referring to FIGS. 2 and 7, in step S141, the error value calculator 242 calculates error values indicating differences between the detected phases phase$_i$ and the estimated phases phase$_{est}$. The error values may be the absolute values of these differences.

Figure 8:
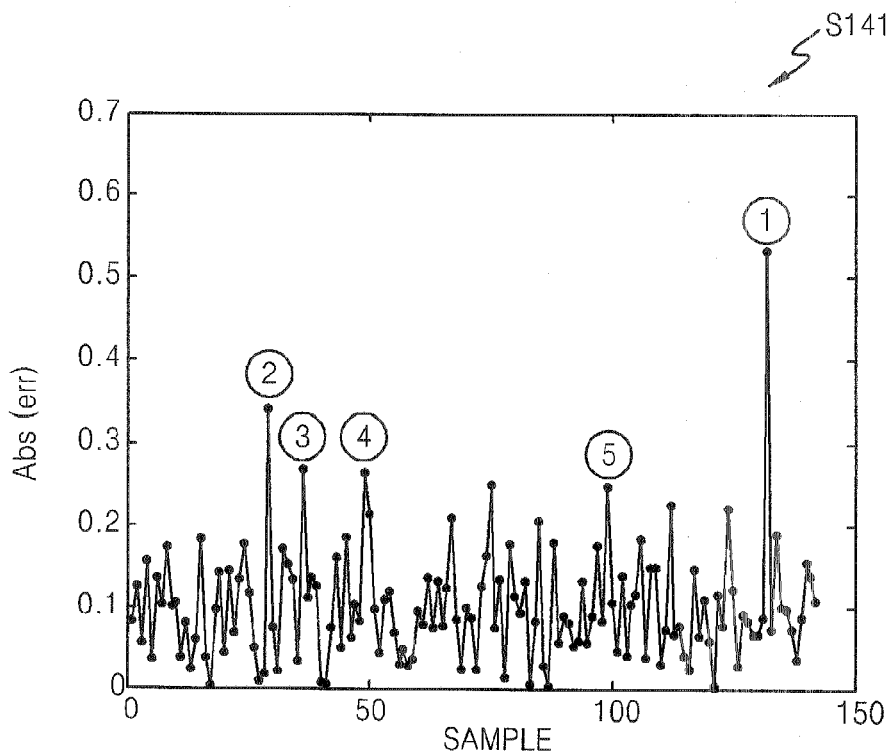
FIG. 8 is a diagram showing error values of received samples of the apparatus or method illustrated in FIG. 2 or 7, respectively.

FIG. 8 is a diagram showing the error values of the received samples SAM of the apparatus or method illustrated in FIG. 2 or 7. FIG. 8 shows the error values ① through ⑤ of the received samples SAM numbered in order of magnitude.

Figure 9:
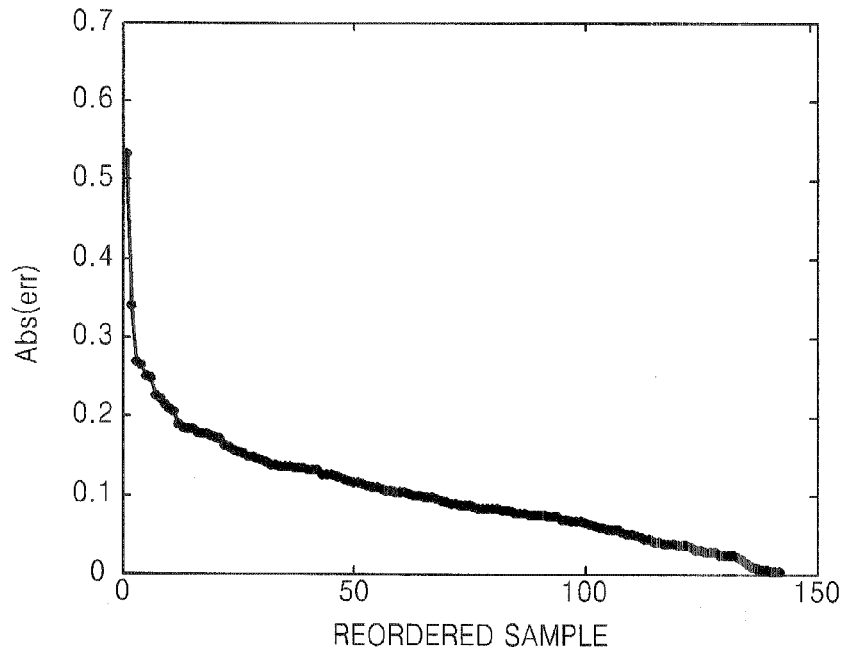
FIG. 9 is a diagram showing error values obtained using the apparatus or method illustrated in FIG. 2 or 7, respectively, arranged in magnitude order.

Referring again to FIGS. 2 and 7, the second estimator 240 may include a reordering unit 244. In step S142, the reordering unit 244 arranges the received samples SAM by the order of magnitude of the error values. FIG. 9 is a diagram showing the error values obtained using the apparatus or method described in connection with FIG. 2 or FIG. 7, respectively, arranged by the order of magnitude.

In step S143, the setting unit 246 sets received samples SAM having an error value greater than a predetermined value among the received samples SAM as the error samples. The predetermined value can be set according to the number of error samples to be skipped. In an exemplary embodiment of the present invention, incorrect offset frequency estimation can be prevented by setting an appropriate number of error samples to be skipped.

In step S144, the estimator 248 estimates the final offset frequency $\hat{\omega}^{tmp}$ using the detected phases $phase_i$ of the received samples SAM excluding the error samples. The final offset frequency $\hat{\omega}^{tmp}$ may be estimated using the least squares method as described above.

A method of obtaining the final offset frequency $\hat{\omega}^{tmp}$ using the detected phases $phase_i$ of the received samples SAM excluding the error samples may include using the Equations 5 through 7 used to obtain the temporary offset frequency $\hat{\omega}$ of the received samples SAM. However, in accordance with an exemplary embodiment of the present invention, the final offset frequency $\hat{\omega}^{tmp}$ that is closer to an actual offset frequency can be obtained by skipping the error samples.

The final offset frequency $\hat{\omega}^{tmp}$ may be obtained using Equation 9.

$$\hat{\omega}^{imp} = \left. \frac{(142-n)\sum_{i=1}^{142} i \cdot phase_i - \sum_{i=1}^{142} i \sum_{i=1}^{142} phase_i}{(142-n)\sum_{i=1}^{142} i^2 - \left(\sum_{i=1}^{142} i\right)^2} \right|_{inside \Sigma_{i \neq b1}} \quad (9)$$

Here, n denotes the number of error samples to be skipped, and {.} denotes an index of the error samples to be skipped.

Figure 10:
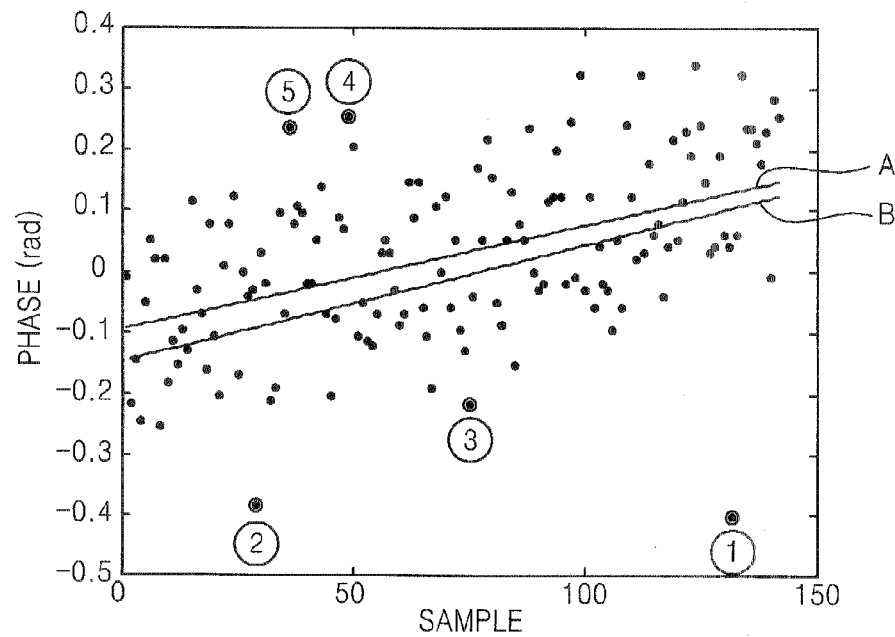
FIG. 10 is a diagram showing a final offset frequency obtained using the method or apparatus illustrated in FIG. 1 or 2, respectively.

FIG. 10 is a diagram showing the final offset frequency $\hat{\omega}^{tmp}$ obtained using the method or apparatus described in connection with FIG. 1 or FIG. 2, respectively.

Referring to FIG. 10, the offset frequency estimation method and apparatus according to the embodiments of the present invention estimates the final offset frequency $\hat{\omega}^{tmp}$ by skipping received samples ① through ⑤ by the order of magnitude of the error samples. A line B has a slope of the final offset frequency $\hat{\omega}^{tmp}$.

Figure 11:
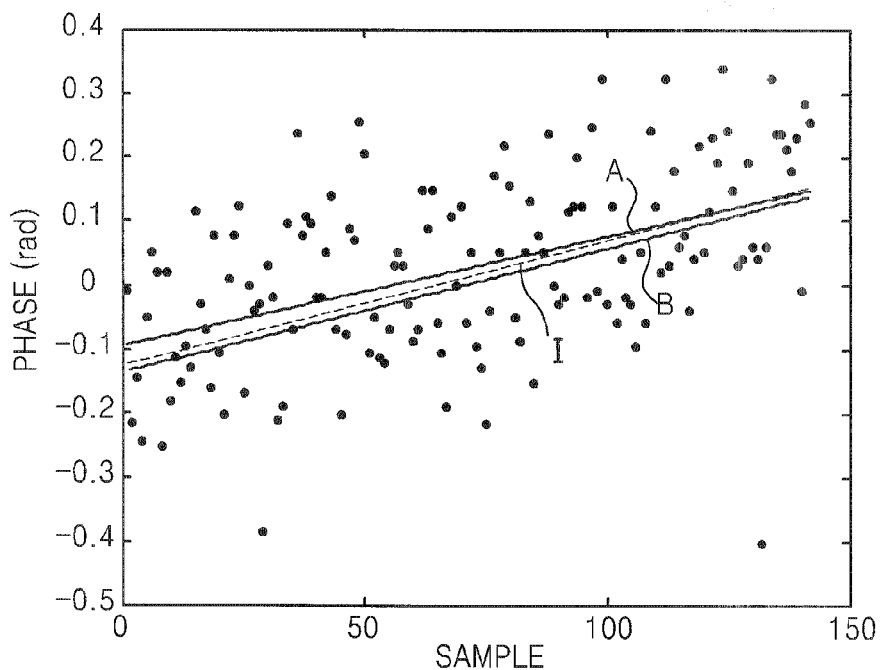
FIG. 11 is a diagram showing a final offset frequency obtained using the method or apparatus illustrated in FIG. 1 or 2, respectively.

FIG. 11 is a diagram showing a final offset frequency $\hat{\omega}^{tmp}$ obtained using the method or apparatus described in connection with FIG. 1 or FIG. 2, respectively. As shown in FIG. 11, the final offset frequency $\hat{\omega}^{tmp}$ obtained according to exemplary embodiments of the present invention has a value closer to the actual offset frequency as compared to the temporary offset frequency $\hat{\omega}$. Here, it is assumed for the convenience of description that a reference character of a line whose slope is an offset frequency indicates the offset frequency.

Referring to FIG. 11, while the conventional offset frequency A is approximately 0.0017, the final offset frequency B estimated according to an exemplary embodiment of the present invention is approximately 0.0019. The actual offset frequency I is approximately 0.0020. Thus, the final offset frequency B, which is an offset frequency according to an exemplary embodiment of the present invention, is closer to the actual offset frequency I than the temporary offset frequency A, which is a conventional offset frequency.

Figure 12:
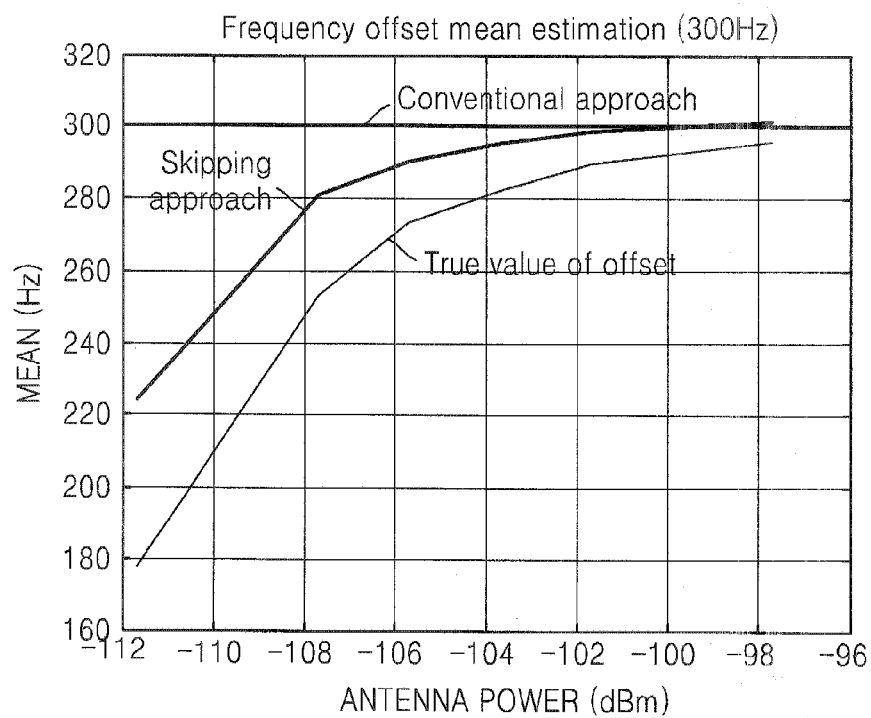
FIG. 12 is a diagram showing a mean value of the final offset frequency obtained using the method or apparatus illustrated in FIG. 1 or 2, respectively.

FIG. 12 is a diagram showing a mean value of the final offset frequency obtained using the method or apparatus described in connection with FIG. 1 or FIG. 2, respectively.

As shown in FIG. 12, a mean value of the final offset frequency obtained according to exemplary embodiments of the present invention is closer to a mean value of the actual offset frequency as compared to the temporary offset frequency.

Figure 13:
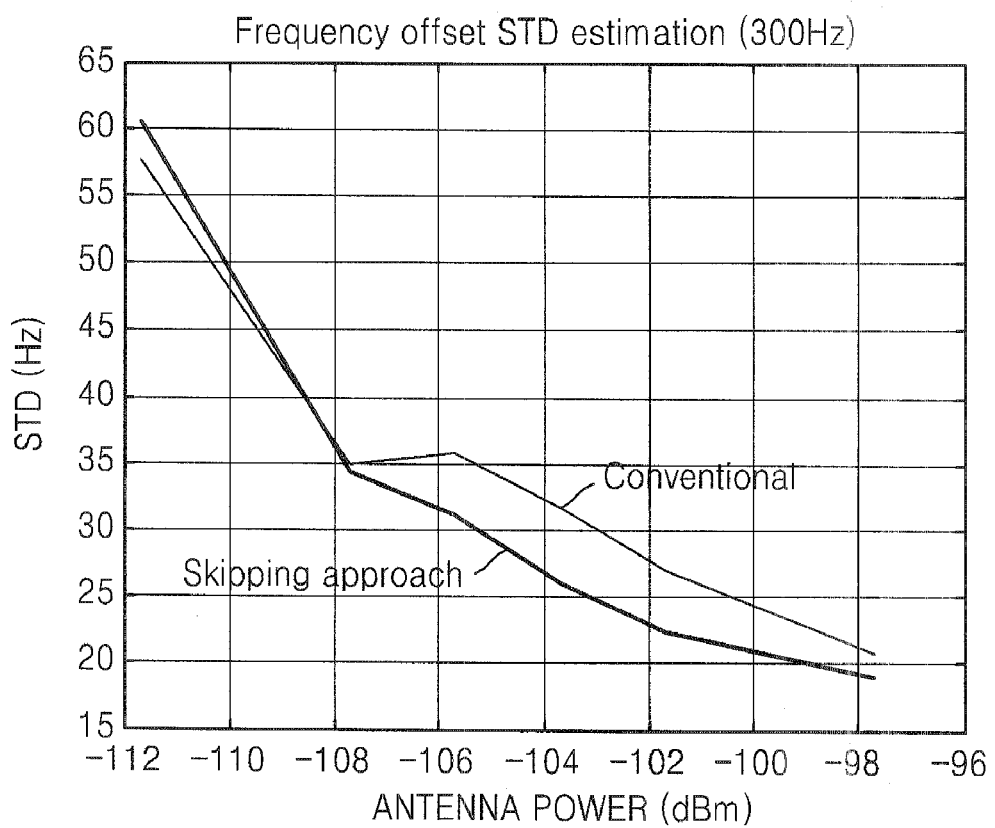
FIG. 13 is a diagram showing a standard deviation of the final offset frequency obtained using the method or apparatus illustrated in FIG. 1 or 2, respectively.

FIG. 13 is a diagram showing a standard deviation of the final offset frequency obtained using the method or apparatus described in connection with FIG. 1 or FIG. 2, respectively. As shown in FIG. 1, the standard deviation of the final offset frequency obtained according to exemplary embodiments of the present invention is less than that of the temporary offset frequency.

Referring to FIGS. 12 and 13, the offset frequency estimated according to exemplary embodiments of the present invention has a closer mean value to a mean value of the actual offset frequency and has a standard deviation which is less than the offset frequency conventionally estimated. As described above, in an offset frequency estimation method and apparatus according to an exemplary embodiment of the present invention, by adaptively skipping error samples, a more correct offset frequency can be estimated.

Although the exemplary embodiments of the present invention have been described in detail with reference to the accompanying drawings for the purpose of illustration, it is to be understood that the inventive processes and apparatus should not be construed as limited thereby. It will be apparent to those of ordinary skill in the art that various modifications to the foregoing exemplary embodiments may be made without departing from the scope of the invention as defined by the appended claims, with equivalents of the claims to be included therein.

What is claimed is:

1. An offset frequency estimation method comprising:
   receiving an input signal comprised of complex samples;
   detecting phases of the complex samples;
   estimating a temporary offset frequency and an initial phase from the detected phases of the complex samples using a linear regression analysis method;
   calculating phase differences between the detected phases and estimated initial phases;
   selecting as error samples complex samples having phase differences greater than a predetermined value; and
   estimating a final offset frequency using detected phases of complex samples excluding the error samples.

2. The offset frequency estimation method of claim 1, wherein the estimated initial phase is obtained using the linear regression analysis method wherein the temporary offset frequency and the initial phase are used as parameters.

3. The offset frequency estimation method of claim 1, wherein the initial phase is a phase difference between transmission and reception systems of the complex samples, which is generated as a result of synchronization mismatching between the transmission and reception systems.

4. The offset frequency estimation method of claim 1 wherein in the estimating of the final offset frequency the final offset frequency is estimated from detected phases of complex samples excluding the error samples among the complex samples.

5. The offset frequency estimation method of claim 1, wherein in the estimating of the final offset frequency the number of error samples to be skipped is set based on an order of magnitude of the error values.

6. The offset frequency estimation method of claim 1, wherein the estimating of the final offset frequency further comprises arranging the complex samples by the order of magnitude of the error values.

7. The offset frequency estimation method of claim 1, wherein the error values are absolute values of the differences between the detected phases and the estimated phases.

8. The offset frequency estimation method of claim 1, wherein the estimated phases are obtained using the linear regression analysis method in which the temporary offset frequency and the initial phase are used as parameters.

9. The offset frequency estimation method of claim 1, wherein the detecting of the phases of the complex samples comprises:
generating a first value by conjugating a reference sample;
generating second values by multiplying the first value by each of the complex samples; and
obtaining each phase of the complex samples using the second values.

10. The offset frequency estimation method of claim 9, wherein the reference sample is a signal without a noise component generated in a transmitting/receiving process of the complex samples.

11. The offset frequency estimation method of claim 9 wherein in the obtaining of each phase of the complex samples from the second value, when the second value is an (A+jB) type complex number, the detected phase of the complex samples is an arctan(B/A).

12. The offset frequency estimation method of claim 1, wherein the detecting of the phases of the complex samples comprises:
generating third values by conjugating each of the complex samples;
generating fourth values by multiplying the third values by a reference sample; and
obtaining each phase of the complex samples using the fourth values.

13. The offset frequency estimation method of claim 1, wherein the linear regression analysis method is a least squares method.

14. An offset frequency estimation apparatus comprising:
a receiver receiving a plurality of complex sample formed by complex;
a phase detector detecting phases of the complex samples;
a first estimator estimating a temporary offset frequency and an initial phase from the detected phases of the complex samples using a linear regression analysis method; and
a second estimator estimating a final offset frequency, wherein the second estimator comprises:
an error value calculator calculating phase differences between the detected phases and estimated phases;
a setting unit selecting as error samples complex samples having phase difference greater than a predetermined error value; and
an estimator estimating the final offset frequency using detected phases of complex samples excluding the error samples.

15. The offset frequency estimation apparatus of claim 14, wherein the estimated initial phase is obtained using the linear regression analysis method in which the temporary offset frequency and the initial phase are used as parameters.

16. The offset frequency estimation apparatus of claim 14, wherein the initial phase is a phase difference between transmission and reception systems of the complex samples, which is generated as a result of synchronization mismatching between the transmission and reception systems.

17. The offset frequency estimation apparatus of claim 14, wherein the estimator estimates the final offset frequency from detected phases of samples excluding the error samples out of the complex samples.

18. The offset frequency estimation apparatus of claim 14, wherein the second estimator further comprises a reordering unit arranging the complex samples by an order of magnitude of the error values.

19. The offset frequency estimation apparatus of claim 18, wherein the setting unit sets the number of error samples to be skipped based on the order of magnitude of the error values.

20. The offset frequency estimation apparatus of claim 14, wherein the error values are absolute values of the differences between the detected phases and the estimated phases.

21. The offset frequency estimation apparatus of claim 14, wherein the estimated phases are obtained using the linear regression analysis method in which the temporary offset frequency and the initial phase are used as parameters.

22. The offset frequency estimation apparatus of claim 14, wherein the phase detector comprises:
a conjugate unit generating a first value by conjugating a reference sample;
a multiplier generating second values by multiplying the first value by each of the complex samples; and
a detector obtaining a phase of each of the complex samples using the second values.

23. The offset frequency estimation apparatus of claim 22, wherein the reference sample is a signal without a noise component generated in a process of transmitting/receiving the complex samples.

24. The offset frequency estimation apparatus of claim 14, wherein the phase detector comprises:
a conjugate unit generating third values by conjugating each of the complex samples;
a multiplier generating fourth values by multiplying the third value by a reference sample; and
a detector obtaining a phase of each of the complex samples using the fourth values.

25. The offset frequency estimation apparatus of claim 14, wherein the linear regression analysis method is a least squares method.

* * * * *